United States Patent
Fujii et al.

(10) Patent No.: US 9,862,646 B2
(45) Date of Patent: Jan. 9, 2018

(54) DIELECTRIC COMPOSITION AND ELECTRONIC COMPONENT

(71) Applicant: TDK CORPORATION, Tokyo (JP)

(72) Inventors: Shohei Fujii, Tokyo (JP); Raitarou Masaoka, Tokyo (JP); Hiroki Uchiyama, Tokyo (JP); Maiko Shirokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/278,725

(22) Filed: Sep. 28, 2016

(65) Prior Publication Data

US 2017/0096371 A1 Apr. 6, 2017

(30) Foreign Application Priority Data

Oct. 6, 2015 (JP) ................. 2015-198667

(51) Int. Cl.

| | |
|---|---|
| *C04B 35/01* | (2006.01) |
| *C04B 35/495* | (2006.01) |
| *H01G 4/08* | (2006.01) |
| *H01G 4/33* | (2006.01) |
| *C04B 35/057* | (2006.01) |
| *H01G 4/12* | (2006.01) |

(Continued)

(52) U.S. Cl.
CPC ............ *C04B 35/057* (2013.01); *C01F 11/02* (2013.01); *C01G 33/006* (2013.01); *C01G 35/006* (2013.01); *C04B 35/01* (2013.01); *C04B 35/495* (2013.01); *H01G 4/1254* (2013.01); *H01G 4/33* (2013.01); *H01L 28/55* (2013.01); *C01P 2006/40* (2013.01); *C04B 2235/3208* (2013.01); *C04B 2235/3213* (2013.01); *C04B 2235/3215* (2013.01); *C04B 2235/3251* (2013.01);

(Continued)

(58) Field of Classification Search
CPC .... C04B 35/495; C04B 35/057; H01G 4/085; H01G 4/10; H01G 4/1254
See application file for complete search history.

(56) References Cited

U.S. PATENT DOCUMENTS

| | | | |
|---|---|---|---|
| 5,124,777 A * | 6/1992 | Lee ........................ | C04B 35/495 257/310 |
| 6,403,053 B1 * | 6/2002 | Fang ..................... | C04B 35/495 423/594.8 |

(Continued)

FOREIGN PATENT DOCUMENTS

| | | | |
|---|---|---|---|
| JP | S51-45799 A | | 4/1976 |
| JP | 55-10449 | * | 12/1980 |

(Continued)

OTHER PUBLICATIONS

T. Yu, et al., "Preperation and charactarization of sol-gel derived CaZrO3 dielectric thin film for high-k applications," Science direct Physica B 348, 440-445 (2004).

*Primary Examiner* — Karl Group
(74) *Attorney, Agent, or Firm* — Oliff PLC

(57) ABSTRACT

A dielectric composition containing a complex oxide represented by the formula of $A_\alpha B_\beta C_{2\gamma} O_{\alpha+\beta+5\gamma}$ as the main component, wherein A represents Ba, B represents at least one element selected from the group consisting of Ca and Sr, C represents at least one element selected from the group consisting of Ta and Nb, and $\alpha$, $\beta$ and $\gamma$ meet the following conditions, i.e., $\alpha+\beta+\gamma=1.000$, $0.000<\alpha\leq0.375$, $0.625\leq\beta<1.000$, $0.000\leq\gamma\leq0.375$.

13 Claims, 1 Drawing Sheet

(51) Int. Cl.
    *H01L 49/02*     (2006.01)
    *C01G 33/00*     (2006.01)
    *C01G 35/00*     (2006.01)
    *C01F 11/02*     (2006.01)

(52) U.S. Cl.
    CPC ............... *C04B 2235/3255* (2013.01); *C04B 2235/6562* (2013.01); *C04B 2235/6567* (2013.01)

(56) References Cited

U.S. PATENT DOCUMENTS

| | | | | |
|---|---|---|---|---|
| 6,528,445 B1 * | 3/2003 | Hong | ............... | C04B 35/495 501/136 |
| 7,381,671 B2 * | 6/2008 | Ogiso | ............... | C04B 35/495 252/62.9 R |
| 2007/0161497 A1 * | 7/2007 | Ogiso | ............... | C04B 35/495 501/134 |
| 2011/0226982 A1 | 9/2011 | Wada et al. | | |
| 2013/0150226 A1 | 6/2013 | Masaoka et al. | | |
| 2016/0115084 A1 * | 4/2016 | Masaoka | ............... | C04B 35/01 501/135 |

FOREIGN PATENT DOCUMENTS

| JP | 62171957 | * | 7/1987 |
| JP | 63155505 | * | 6/1988 |
| JP | 63198207 | * | 8/1988 |
| JP | 09208394 | * | 8/1997 |
| JP | 2013-144631 A | | 7/2013 |
| KR | 2011-0104441 A | | 9/2011 |

\* cited by examiner

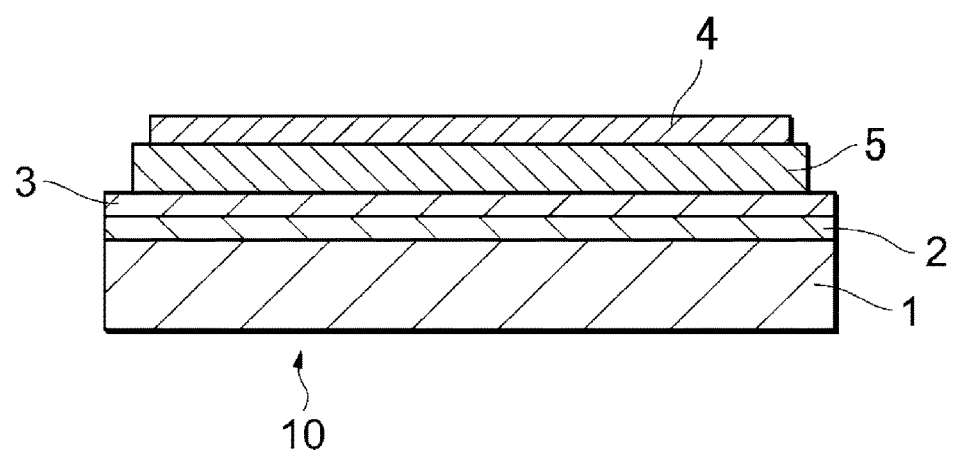

DIELECTRIC COMPOSITION AND ELECTRONIC COMPONENT

The present invention relates to a dielectric composition and an electronic component.

BACKGROUND

The MIMO (Multi-Input Multi-Output) technique which simultaneously utilizes a plurality of frequency bands has been put into use so as to provide a communication with a higher speed and a larger capacity in mobile communicating equipment which is represented by a smart phone or a tablet. Since each frequency band needs a RF component, if the frequency bands for communication are increased in number, in order to maintain the original size of the equipment where increased components are disposed, each component needs to be further downsized and provided with more functions.

Such an electronic component working at a high frequency can be, for example, a diplexer, a band-pass filter or the like. All of these components contain the combination of dielectric material(s) functioning as capacitor and magnetic material(s) functioning as inductor. In order to provide good high-frequency characteristics, each kinds of loss at a high-frequency region are required to be suppressed.

The requirements for the dielectric material are as follows. (1) According to the requirements for downsizing, the relative permittivity ($\in$r) is required to be high in order to decrease the area of the capacitor. (2) The dielectric loss is required to be low, i.e., the Q value is required to be high in order to obtain a good selectivity in frequencies. (3) The breakdown voltage is required to be high.

For example, generally speaking, the Q value of the amorphous film of SiNx under a high frequency (2 GHz) is as high as about 500, and the breakdown voltage is as high as about 500 to 700 V/μm, thus, it can be widely used in the electronic components using under the high frequency. However, its relative permittivity ($\in$r) is as low as about 7, so a large area is needed to provide the target functions. In this respect, it is hard to meet the downsizing requirements.

In Non-Patent Document 1, in the $CaZrO_3$ film, a Ca—Zr—O amorphous film is formed by providing an annealing process after the film deposition. At this time, it is reported that the relative permittivity at 100 kHz of the Ca—Zr—O amorphous film is 12.8~16.0, and the Q value is 370 to 555.

Non-Patent Document

Non-Patent Document 1: Science direct Physica B, 348 (2004) 440-445, Preparation and characterization of sol-gel derived $CaZrO_3$ dielectric thin film for high-k applications.

SUMMARY

In Non-Patent Document 1, the Q value is 370 to 555 at a measuring frequency of 100 kHz, and is 200 or below at a measuring frequency of 1 MHz. A tendency of the decreasing of the Q value accompanying with the increasing of the measuring frequency can be observed, thus, it can be predicted that the Q value will further decrease under 2 GHz. In addition, the breakdown voltage is as low as 260V/μm. As a result, the relative permittivity will be about 2 times or higher compared with the amorphous SiNx while the Q value and the breakdown voltage will not be improved.

The present invention has been completed in view of the actual conditions mentioned above. The present invention aims to provide a dielectric composition with a high relative permittivity, a high Q value, and a high breakdown voltage even under a field of a high frequency (2 GHz) and also an electronic component using the dielectric composition.

In order to achieve the mentioned aim, the dielectric composition according to the present invention is characterized in that it comprises a complex oxide represented by the formula of $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb) as the main component, wherein α, β and γ meet the following relationship, $\alpha+\beta+\gamma=1.000$, $0.000<\alpha\leq0.375$, $0.625\leq\beta<1.000$ and $0.000\leq\gamma\leq0.375$.

A high relative permittivity, a high Q value and a high breakdown voltage can be obtained even under the field of a high frequency (2 GHz) when the α, β and γ are within the range mentioned above.

Further, compared to the conventional dielectric composition used in an electronic component working at a high frequency, the use of the dielectric composition of the present invention can satisfy the requirements of downsizing because it can obtain a sufficiently high relative permittivity under a high frequency (2 GHz). Further, as the Q value is higher than the conventional dielectric composition, i.e., a higher S/N ratio is obtained, and further, the breakdown voltage is high, thus, an electronic component such as a dielectric resonator or a dielectric filter with a better performance can be provided.

According to the present invention, a dielectric composition with a high relative permittivity and Q value under a high frequency (2 GHz) and a high breakdown voltage can be provided and also an electronic component using the dielectric composition.

BRIEF DESCRIPTION OF THE DRAWINGS

The FIGURE is a cross-sectional view of a film capacitor in one embodiment of the present invention.

DETAILED DESCRIPTION OF EMBODIMENTS (Film Capacitor 10)

The FIGURE is a cross-sectional view of film capacitor 10 as an example of the electronic component using the dielectric composition in one embodiment of the present invention. Film capacitor 10 is provided with lower electrode 3, upper electrode 4 and dielectric film 5 disposed between lower electrode 3 and upper electrode 4, which three are laminated on the surface of supporting substrate 1. Foundation layer 2 is provided between supporting substrate 1 and lower electrode 3 to enhance the adhesion between them. Supporting substrate 1 guarantees the whole mechanical strength of film capacitor 10.

The shape of the film capacitor is not particularly restricted and is usually cuboid. Further, its size is not particularly restricted. The thickness or the length can be appropriately set in accordance with specific uses.

(Supporting Substrate 1)

There is no particular restriction on the material for forming supporting substrate 1 as shown in the FIGURE. For example, substrate of single crystals such as single crystalline Si, single crystalline SiGe, single crystalline GaAs, single crystalline InP, single crystalline $SrTiO_3$, single crystalline MgO, single crystalline $LaAlO_3$, single crystalline $ZrO_2$, single crystalline $MgAl_2O_4$ and single crystalline $NdGaO_3$, or ceramic polycrystalline substrate such as polycrystalline $Al_2O_3$, polycrystalline ZnO and polycrystalline $SiO_2$, or metals such as Ni, Cu, Ti, W, Mo, Al, Pt or the like or the alloys thereof can form supporting substrate 1, but there is no particular restriction. Among these materials, the single crystalline Si is usually used as the substrate from the viewpoint of the low cost and good processabilities. The resistivity of supporting substrate 1 varies depending on the material of the substrate. When a material having a low resistivity is used as the substrate, the leakage of the current flowing towards the substrate side will affect the electric properties of film capacitor 10 if such a substrate is directly used. Thus, sometimes an insulating treatment can be performed on the surface of supporting substrate 1 so as to prevent the current in use from flowing to supporting substrate 1. For example, when the single crystalline Si is used as supporting substrate 1, the surface of supporting substrate 1 can be oxidized to form an insulating layer of $SiO_2$. Alternatively, insulating materials such as $Al_2O_3$, $SiO_2$, $Si_3N_x$ or the like can be formed on the surface of supporting substrate 1. The material or the film thickness for the insulating layer is not restricted as long as supporting substrate 1 can be kept to be insulated. However, the film thickness is preferred to be 0.01 μm or more. A thickness less than 0.01 μm cannot ensure the insulation and thus is not preferred as the thickness of the insulating layer. There is no particular restriction on the thickness of the supporting substrate 1 as long as the mechanical strength of the whole film capacitor can be ensured. For example, the thickness can be set to be 10 μm to 5000 μm. When the thickness is thinner than 10 μm, the mechanical strength may not be ensured. On the other hand, if the thickness is thicker than 5000 μm, a problem may be caused that it cannot contribute to the downsizing of the electronic component.

(Foundation Layer 2)

In the present embodiment, it is preferred to have foundation layer 2 on the surface of supporting substrate 1 which has been provided with an insulating treatment. Foundation layer 2 is inserted to enhance the adhesion between supporting substrate 1 and lower electrode 3. As an example, Cr is usually inserted as foundation layer 2 when Cu is used in lower electrode 3 and Ti is usually inserted as foundation layer 2 when Pt is used as lower electrode 3.

Foundation layer 2 is not restricted to the above materials listed as examples because the purpose is to improve the adhesion between supporting substrate 1 and lower electrode 3. In addition, foundation layer 2 can be omitted if the adhesion between supporting substrate 1 and lower electrode 3 can be guaranteed.

(Lower Electrode 3)

The material for forming lower electrode 3 is not particularly restricted as long as it is conductive. For instance, lower electrode 3 can be formed by metals such as Pt, Ru, Rh, Pd, Ir, Au, Ag, Cu, Ni and the like or the alloys thereof or the conductive oxides thereof. In this respect, a material can be selected in accordance with the cost or the atmosphere during the thermal treatment for dielectric film 5. In addition to air, the thermal treatment for dielectric film 5 can also be carried out in an inert gas such as $N_2$ or Ar, or a mixed gas of an inert gas and a reductive gas $H_2$. The film thickness of lower electrode 3 is not particularly restricted as long as lower electrode 3 can function as an electrode. Further, the thickness is preferred to be 10 nm or more. A thickness less than 10 nm is not preferable because the conductivity will deteriorate in that case. In addition, when a substrate composed of Cu, Ni, Pt or the like or a conductive oxide material, which can be used as an electrode, is used as supporting substrate 1, foundation layer 2 and lower electrode 3 mentioned above can be omitted.

Lower electrode 3 is preferably formed by various film-deposition methods such as vacuum evaporation, sputtering, PLD (Pulsed laser deposition), MO-CVD (Metal-organic chemical vapor deposition), MOD (Metal organic decomposition) or Sol-Gel, CSD (Chemical solution deposition) or the like. At that time, a trace of impurities or subcomponents may be contained in the starting material in use (i.e., the deposition material, various target materials, organometalic material and etc.), but no particular problem will arise as long as they are not impurities which will significantly deteriorate the conductivity.

A thermal treatment can be provided after the formation of the lower electrode 3 so as to improve the adhesion between foundation layer 2 and lower electrode 3 and also to improve the stability of lower electrode 3. When the thermal treatment is performed, the heating rate is preferably 10° C./min to 2000° C./min, and more preferably 100° C./min to 1000° C./min. The holding temperature during the thermal treatment is preferably 400° C. to 800° C., and the holding time is preferred to be 0.1 hour to 4.0 hours. If any parameter goes beyond the ranges mentioned above, the adhesion will not be good and the surface of lower electrode 3 will be uneven so that the dielectric properties of dielectric film 5 is likely to deteriorate.

(Dielectric Film 5)

The dielectric composition for forming dielectric film 5 comprises a complex oxide represented by the formula of $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb) as the main component.

Further, $\alpha$, $\beta$ and $\gamma$ of the dielectric composition meet the following relationship, i.e., $\alpha+\beta+\gamma=1.000$, $0.000<\alpha\leq0.375$, $0.625\leq\beta<1.000$ and $0.000\leq\gamma\leq0.375$.

As the oxides of Ca or Sr which constitutes B of the formula, CaO or SrO are materials with high Q value and high breakdown voltage, but there is a problem for its low relative permittivity. Thus, in order to improve the relative permittivity, the inventors of the present invention find that the relative permittivity can be improved without decreasing the already obtained Q value and breakdown voltage by containing proper amount of BaO in the dielectric composition containing the mentioned CaO or SrO.

Further, it is found that the moisture resistance is improved by containing proper amount of Ta or Nb which constitutes C of the formula.

A dielectric composition with a high relative permittivity, a high Q value and a high breakdown voltage under a high frequency (2 GHz) can be obtained by controlling the relationship of $\alpha$, $\beta$ and $\gamma$ of the dielectric composition meet the following relationship, i.e., $\alpha+\beta+\gamma=1.000$, $0.000<\alpha\leq0.375$, $0.625\leq\beta<1.000$ and $0.000\leq\gamma\leq0.375$. It is preferred that $\alpha+\beta+\gamma=1.000$, $0.005\leq\alpha\leq0.375$, $0.625\leq\beta\leq0.995$ and $0.000\leq\gamma\leq0.375$. On the other hand, if $\alpha$ is more than 0.375, a high Q value cannot be obtained and when $\alpha=0$, an expected relative permittivity cannot be obtained. In addition, when $\beta$ is less than 0.625, a high Q value cannot be obtained. Further, if $\gamma$ exceeds 0.375, excessive Ta or Nb will form a different phase and the different phase will exist in the grain boundary in a large amount, thus, the high Q value cannot be maintained.

In addition, the relationship of $\alpha$, $\beta$ and $\gamma$ of the dielectric composition is preferred to be as follows, i.e., $\alpha+\beta+\gamma=1.000$, $0.000\leq\alpha\leq0.375$, $0.625\leq\beta\leq1.000$ and $0.000\leq\gamma\leq0.375$. That is, it is preferred to contain proper amount of Ta or Nb which constitutes C in the formula.

In this way, a dielectric composition can be obtained which can possess a high relative permittivity, a high Q value and a high breakdown voltage under a high frequency (2 GHz) and further have a high moisture resistance. That is, when the dielectric composition was provided with a pressure cooker test under a condition with a temperature of 121° C., a humidity of 95% RH and a pressure of 2 atm for 100 hours, the dielectric can still show an approximately equal character as the initial character.

In addition, in order to obtain a higher relative permittivity, the relationship of $\alpha$, $\beta$ and $\gamma$ is preferred to be as follows, i.e., $\alpha+\beta+\gamma=1.000$, $0.100 \leq \alpha \leq 0.375$, $0.625 \leq \beta \leq 0.900$ and $0.000 < \gamma \leq 0.275$, and more preferably $0.100 \leq \alpha \leq 0.375$, $0.625 \leq \beta \leq 0.895$ and $0.005 \leq \gamma \leq 0.275$.

Further, in order to obtain a higher Q value, the relationship of $\alpha$, $\beta$ and $\gamma$ is preferred to be as follows, i.e., $\alpha+\beta+\gamma=1.000$, $0.000 < \alpha \leq 0.180$, $0.770 \leq \beta < 1.000$ and $0.000 < \gamma \leq 0.050$, and more preferably $0.005 \leq \alpha \leq 0.180$, $0.770 \leq \beta \leq 0.990$ and $0.005 \leq \gamma \leq 0.050$.

Further, in order to obtain a higher breakdown voltage, the relationship of $\alpha$, $\beta$ and $\gamma$ is preferred to be as follows, i.e., $\alpha+\beta+\gamma=1.000$, $0.000 < \alpha \leq 0.215$, $0.770 \leq \beta < 1.000$ and $0.000 < \gamma \leq 0.015$, and more preferably $0.005 < \alpha \leq 0.215$, $0.770 \leq \beta \leq 0.990$ and $0.005 \leq \gamma \leq 0.015$.

Further, the relationship of $\alpha$, $\beta$ and $\gamma$ is preferred to be as follows, i.e., $\alpha+\beta+\gamma=1.000$, $0.100 \leq \alpha \leq 0.180$, $0.805 \leq \beta \leq 0.900$ and $0.000 < \gamma \leq 0.015$, and more preferably $0.100 \leq \alpha \leq 0.180$, $0.805 \leq \beta \leq 0.895$ and $0.005 \leq \gamma \leq 0.015$. In this way, the relative permittivity, the Q value and the breakdown voltage can all be increased.

The thickness of the dielectric film 5 is preferably 10 nm to 2000 nm, and more preferably 50 nm to 1000 nm. If the thickness is less than 10 nm, the dielectric breakdown is likely to happen. When the thickness exceeds 2000 nm, the area of the electrode needs to be broadened so as to enlarge the electrostatic capacity of the capacitor, and it may be hard to downsize according to the designs of the electronic component. In the measurement of the thickness of the dielectric film, the electronic component can be milled by a processing device involving FIB (focused ion beam), and then the obtained cross-section is observed by an SIM (scanning ion microscope) to measure the thickness.

Dielectric film 5 is preferably formed by various deposition methods such as vacuum evaporation, sputtering, PLD (Pulsed laser deposition), MO-CVD (Metal-organic chemical vapor deposition), MOD (Metal organic decomposition) or Sol-Gel, CSD (Chemical solution deposition) or the like. At that time, a trace of impurities or subcomponents may be contained in the starting material in use (i.e., the deposition material, various target materials, organometalic material and etc.), but no particular problem will arise as long as they are not impurities which will significantly deteriorate the insulation properties.

Further, a trace of impurities or subcomponents may be contained in the dielectric composition as long as they are not matters which will significantly deteriorate the effect of the present invention (i.e., the relative permittivity, the Q value, or the breakdown voltage). Thus, the amount of the main component as the balance is not particularly restricted. For example, the amount of the main component is 50 mol % or more and 100 mol % or less relative to the whole dielectric composition comprising the main component.

In addition, the dielectric film 5 usually contains the dielectric composition of the present invention as the main component, but it can also be a laminated structure in combination with films made of other dielectric compositions. For example, by making into a laminated structure with the conventional amorphous dielectric films or the crystalline films such as $SiN_x$, $SiO_x$, $AlO_x$, $ZrO_x$, $TaO_x$ or the like, the impedance or the temperature dependence of relative permittivity of the dielectric film 5 can be adjusted.

(Upper Electrode 4)

In one example of the present embodiment, film capacitor 10 is provided with upper electrode 4 on the surface of dielectric film 5, wherein upper electrode 4 functions as another electrode in film capacitor 10. The material for forming upper electrode 4 is not particularly restricted as long as it is conductive. Upper electrode 4 can be formed by the same material as that for lower electrode 3. Also, the film thickness of upper electrode 4 is not particularly restricted as long as the function as an electrode can be exerted, and the thickness is preferred to be 10 nm or more. A film thickness of 10 nm or less is not preferable for upper electrode 4 because the conductivity will deteriorate in that case.

Upper electrode 4 is preferably formed by various film-deposition methods such as vacuum evaporation, sputtering, PLD (Pulsed laser deposition), MO-CVD (Metal-organic chemical vapor deposition), MOD (Metal organic decomposition) or Sol-Gel, CSD (Chemical solution deposition) or the like. At that time, a trace of impurities or subcomponents may be contained in the starting material in use (i.e., the deposition material, various target materials, organometalic material and etc.), but no particular problem will arise as long as they are not impurities which will significantly deteriorate the conductivity.

In the embodiment mentioned above, a film capacitor is presented as an example of the electronic component using the dielectric composition according to one embodiment of the present invention. However, the electronic component using the dielectric composition of the present invention is not limited to the film capacitor and also can be any electronic component having a dielectric film such as a diplexer, a band-pass filter, a balun or a coupler.

EXAMPLES

Hereinafter, the present invention will be further described based on detailed examples, but the present invention is not limited to these examples.

Example 1 (Comparative Example 1)

First of all, a Ti film as the foundation layer with a thickness of 20 nm was deposited by a sputtering method on the surface of a square supporting substrate of 10 mm×10 mm with a thickness of 350 μm, wherein, the supporting substrate had a $SiO_2$ insulating film with a thickness of 6 μm on the surface of Si.

Next, a Pt film as the lower electrode with a thickness of 100 nm was deposited by sputtering method on the deposited Ti film mentioned above.

The formed Ti/Pt film was provided with a thermal treatment at the normal pressure under oxygen atmosphere with a heating rate of 400° C./min and a holding temperature of 700° C. for 0.5 hour.

The PLD method was used in the formation of the dielectric film. The targets necessary in the formation of the dielectric film were prepared as follow.

First, $BaCO_3$, $CaCO_3$, $SrCO_3$, $Ta_2O_5$ and $Nb_2O_5$ was weighed to get the amounts of Ba, Ca, Sr, Ta, and Nb in Sample No. 1 to Sample No. 36 as shown in Table 1. The weighed starting powders together with absolute ethanol and $ZrO_2$ beads of φ2 mm were put into a wide-mouth poly-pot of 1 L and then subjected to wet mixing for 20 hours. Then, the slurry of the mixed powder was dried at 100° C. for 20 hours. The obtained mixed powder was put into a crucible made of $Al_2O_3$ and the pre-calcination was performed in air at 1250° C. for 5 hours to provide the pre-calcined powder.

A molded body was obtained by using a uniaxial pressing machine from the obtained calcined powder. The press condition was set with a pressure of $2.0 \times 10^8$ Pa and a temperature of room temperature.

After that, a sintering process was performed for the obtained molded body under atmospheric air with a heating rate of 200° C./hour and a holding temperature of 1600° C. to 1700° C. for 12 hours.

Next, the obtained sintered body was ground on both surfaces by using a cylindrical grinding machine until the thickness became 4 mm, so the target for PLD necessary in the deposition of the dielectric film was prepared.

Thus prepared target for PLD was used in the PLD method to form a dielectric film with a thickness of 200 nm to 800 nm on the lower electrode. During the film-depositing using the PLD method, the oxygen pressure was controlled to be $1 \times 10^{-1}$ Pa and the substrate was heated to 200° C. In addition, in order to expose part of the lower electrode, a metal mask was used to form an area where no dielectric film was deposited.

In the measurement of the thickness of the dielectric film, it was milled by FIB and then the resultant cross-section was observed by SIM to measure the thickness.

After deposition, the composition of the dielectric film was analyzed in all samples by using an XRF (X-ray fluorescence analyzer), and the composition was confirmed as described in Table 1.

Thereafter, a vapor deposition apparatus was used to deposit an Ag film as the upper electrode on the obtained dielectric film. The upper electrode was formed to have a diameter of 100 μm and a thickness of 100 nm with the use of a metal mask, thus providing Sample No. 1 to Sample No. 36 with the structure shown in the FIGURE.

As for all the obtained film capacitor samples, the relative permittivity, the Q value and the breakdown voltage were respectively measured by the following methods.

(Relative Permittivity and Q Value)

The relative permittivity and the Q value of the film capacitor samples were calculated based on the results from the measurement of the electrostatic capacity and film thickness under a frequency of 2 GHz and an input signal level (measuring voltage) of 0.5 Vrms at a reference temperature of 25° C. using an RF impedance/material analyzer (4991A produced by Agilent Technologies). The relative permittivity of the amorphous SiNx film was about 7. Thus, a relative permittivity of 11 or more which is 1.5 times of that of the amorphous SiNx film was deemed as a good result. In addition, the Q value of the amorphous SiNx film was about 500. Thus, a Q value of more than 500 was deemed as a good result.

(Breakdown Voltage (Vbd))

As for all the film capacitor samples, a digital ultra-high resistance/micro current meters (ADVANTEST R8340) was connected with the exposed area of the lower electrode and also the upper electrode. A voltage was applied in a step of 5V/second to perform the measurement, and the voltage value was read when the resistance value dropped by double digits from the initial resistance value. The value was regarded as the breakdown voltage value (the unit was V) of the sample. The value obtained by dividing the breakdown voltage value (the unit was V) by the thickness of the dielectric film was deemed as the breakdown voltage Vbd (V/μm). In Table 1, the average value of n=5 was shown. The breakdown voltage of the amorphous SiNx film was about 500 to 700 V/μm, thus, a dielectric breakdown voltage of 700 V/μm or more was deemed as a good result.

As for all the obtained film capacitor samples, a pressure cooker test (PCT) under the following condition was performed as the moisture resistance test.

The film capacitor sample was put in a constant temperature bath with a temperature of 121° C., a humidity of 95% RH and a pressure of 2 atm for 100 hours. Then, it was taken out from the constant temperature bath. The relative permittivity, the Q value and the dielectric breakdown voltage were measured under the room temperature. If the relative permittivity, the Q value and the dielectric breakdown voltage were all values within a range of ±5% compared with the value before the test and the moisture resistance was also excellent, the result would be judged as ⊚. If the relative permittivity, the Q value and the dielectric breakdown voltage were all values within a range of ±10% compared with the value before the test and the moisture resistance was good, the result would be judged as ○.

TABLE 1

| | Sample No. | A | α | B | β | C | γ | relative permittivity (—) | Q value (—) | Vbd (V/μm) | moisture resistance | film thickness (nm) | film forming method |
|---|---|---|---|---|---|---|---|---|---|---|---|---|---|
| Example 1 | 1 | Ba | 0.375 | Ca | 0.625 | — | 0.000 | 18 | 510 | 780 | ○ | 400 | PLD |
| | 2 | Ba | 0.005 | Ca | 0.990 | Ta | 0.005 | 11 | 860 | 1240 | ⊚ | 400 | PLD |
| | 3 | Ba | 0.005 | Ca | 0.995 | — | 0.000 | 11 | 870 | 1250 | ○ | 400 | PLD |
| | 4 | Ba | 0.005 | Ca | 0.625 | Ta | 0.370 | 12 | 520 | 770 | ⊚ | 400 | PLD |
| | 5 | Ba | 0.100 | Ca | 0.900 | — | 0.000 | 14 | 820 | 1170 | ○ | 400 | PLD |
| | 6 | Ba | 0.100 | Ca | 0.625 | Ta | 0.275 | 15 | 510 | 750 | ⊚ | 400 | PLD |
| | 7 | Ba | 0.180 | Ca | 0.820 | — | 0.000 | 15 | 760 | 1180 | ○ | 400 | PLD |
| | 8 | Ba | 0.180 | Ca | 0.770 | Ta | 0.050 | 16 | 750 | 840 | ⊚ | 400 | PLD |
| | 9 | Ba | 0.005 | Ca | 0.945 | Ta | 0.050 | 11 | 780 | 900 | ⊚ | 400 | PLD |
| | 10 | Ba | 0.215 | Ca | 0.785 | — | 0.000 | 16 | 630 | 1140 | ○ | 400 | PLD |
| | 11 | Ba | 0.215 | Ca | 0.770 | Ta | 0.015 | 16 | 600 | 1120 | ⊚ | 400 | PLD |
| | 12 | Ba | 0.005 | Ca | 0.980 | Ta | 0.015 | 11 | 800 | 1210 | ⊚ | 400 | PLD |
| | 13 | Ba | 0.180 | Ca | 0.805 | Ta | 0.015 | 15 | 760 | 1180 | ⊚ | 400 | PLD |
| | 14 | Ba | 0.100 | Ca | 0.885 | Ta | 0.015 | 14 | 790 | 1120 | ⊚ | 400 | PLD |
| | 15 | Ba | 0.050 | Ca | 0.760 | Ta | 0.190 | 13 | 610 | 920 | ⊚ | 400 | PLD |
| | 16 | Ba | 0.190 | Ca | 0.710 | Ta | 0.100 | 17 | 590 | 870 | ⊚ | 400 | PLD |
| | 17 | Ba | 0.050 | Ca | 0.919 | Ta | 0.031 | 11 | 790 | 990 | ⊚ | 400 | PLD |
| | 18 | Ba | 0.050 | Ca | 0.942 | Ta | 0.008 | 11 | 800 | 1200 | ⊚ | 400 | PLD |
| | 19 | Ba | 0.140 | Ca | 0.829 | Ta | 0.031 | 15 | 770 | 1060 | ⊚ | 400 | PLD |
| | 20 | Ba | 0.198 | Ca | 0.794 | Ta | 0.008 | 16 | 720 | 1150 | ⊚ | 400 | PLD |
| | 21 | Ba | 0.140 | Ca | 0.852 | Ta | 0.008 | 14 | 790 | 1240 | ⊚ | 400 | PLD |
| | 22 | Ba | 0.140 | Ca | 0.852 | Ta, Nb | 0.008 | 14 | 770 | 1260 | ⊚ | 400 | PLD |

TABLE 1-continued

|  | Sample No. | A | α | B | β | C | γ | relative permittivity (—) | Q value (—) | Vbd (V/μm) | moisture resistance | film thickness (nm) | film forming method |
|---|---|---|---|---|---|---|---|---|---|---|---|---|---|
|  | 23 | Ba | 0.140 | Ca | 0.852 | Nb | 0.008 | 14 | 760 | 1270 | ◎ | 400 | PLD |
|  | 24 | Ba | 0.140 | Ca, Sr | 0.852 | Ta | 0.008 | 15 | 780 | 1180 | ◎ | 400 | PLD |
|  | 25 | Ba | 0.140 | Ca, Sr | 0.852 | Ta, Nb | 0.008 | 15 | 770 | 1190 | ◎ | 400 | PLD |
|  | 26 | Ba | 0.140 | Ca, Sr | 0.852 | Nb | 0.008 | 15 | 760 | 1210 | ◎ | 400 | PLD |
|  | 27 | Ba | 0.140 | Sr | 0.852 | Ta | 0.008 | 16 | 770 | 1130 | ◎ | 400 | PLD |
|  | 28 | Ba | 0.140 | Sr | 0.852 | Ta, Nb | 0.008 | 16 | 760 | 1150 | ◎ | 400 | PLD |
|  | 29 | Ba | 0.140 | Sr | 0.852 | Nb | 0.008 | 16 | 750 | 1160 | ◎ | 400 | PLD |
|  | 30 | Ba | 0.140 | Ca | 0.852 | Ta | 0.008 | 14 | 780 | 1220 | ◎ | 200 | PLD |
|  | 31 | Ba | 0.140 | Ca | 0.852 | Ta | 0.008 | 14 | 800 | 1250 | ◎ | 800 | PLD |
| Comparative Example | 32 | Ba | 0.410 | Ca | 0.590 | — | 0.000 | 18 | 480 | 720 | ○ | 400 | PLD |
|  | 33 | Ba | 0.300 | Ca | 0.590 | Ta | 0.110 | 20 | 450 | 670 | ◎ | 400 | PLD |
|  | 34 | Ba | 0.150 | Ca | 0.590 | Ta | 0.260 | 14 | 440 | 640 | ◎ | 400 | PLD |
|  | 35 | Ba | 0.005 | Ca | 0.585 | Ta | 0.410 | 12 | 470 | 670 | ◎ | 400 | PLD |
|  | 36 | — | 0.000 | Ca | 1.000 | — | 0.000 | 9 | 840 | 1250 | ○ | 400 | PLD |

Samples No. 1 to 31

According to Table 1, Samples No. 1 to 31 were dielectric films containing $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb) and the relationships of α, β and γ in these samples were as follows, i.e., $\alpha+\beta+\gamma=1.000$, $0.000<\alpha\leq0.375$, $0.625\leq\beta<1.000$ and $0.000\leq\gamma\leq0.375$. It was confirmed that the Samples No. 1 to 31 had excellent properties, wherein, the relative permittivity was 11 or above, the Q value was 500 or above and the dielectric breakdown voltage was 700V/μm or above.

Samples No. 2, 4, 6, 8, 9, 11 to 31

According to Table 1, Samples No. 2, 4, 6, 8, 9, 11 to 31 were dielectric films containing $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb) and the relationships of α, β and γ in these samples were as follows, i.e., $\alpha+\beta+\gamma=1.000$, $0.000<\alpha\leq0.375$, $0.625\leq\beta<1.000$ and $0.000<\gamma\leq0.375$. It was confirmed that in the Samples No. 2, 4, 6, 8, 9, 11 to 31, the relative permittivity was 11 or above, the Q value was 500 or above, the dielectric breakdown voltage was 700V/μm or above and further the moisture resistance was also excellent.

Samples No. 6, 8, 11, 13, 14, 16, 19 to 31

According to Table 1, it could be confirmed that in Samples No. 6, 8, 11, 13, 14, 16, 19 to 31 where the relationships of α, β and γ in these samples were as follows, i.e., $\alpha+\beta+\gamma=1.000$, $0.100\leq\alpha\leq0.375$, $0.625\leq\beta\leq0.900$ and $0.000<\gamma\leq0.275$, a higher relative permittivity could be obtained while the Q value and the dielectric breakdown voltage were maintained.

Samples No. 2, 8, 9, 12 to 14, 17 to 19, 21 to 31

According to Table 1, it could be confirmed that in Samples No. 2, 8, 9, 12 to 14, 17 to 19, 21 to 31 where the relationships of α, β and γ in these samples were as follows, i.e., $\alpha+\beta+\gamma=1.000$, $0.000<\alpha\leq0.180$, $0.770\leq\beta<1.000$ and $0.000<\gamma\leq0.050$, a higher Q value could be obtained with the relative permittivity and the dielectric breakdown voltage maintained.

Samples No. 2, 11 to 14, 18, 20, 21 to 31

According to Table 1, it could be confirmed that in Samples No. 2, 11 to 14, 18, 20, 21 to 31 where the relationships of α, β and γ in these samples were as follows, i.e., $\alpha+\beta+\gamma=1.000$, $0.000<\alpha\leq0.215$, $0.770\leq\beta<1.000$ and $0.000<\gamma\leq0.015$, a higher dielectric breakdown voltage could be obtained while the relative permittivity and the Q value were maintained.

Samples No. 13, 14, 21 to 31

According to Table 1, it could be confirmed that in Samples No. 13, 14, 21 to 31 where the relationships of α, β and γ in these samples were as follows, i.e., $\alpha+\beta+\gamma=1.000$, $0.100\leq\alpha\leq0.180$, $0.805\leq\beta\leq0.900$ and $0.000<\gamma\leq0.015$, all of properties of the relative permittivity, the Q value and the dielectric breakdown voltage could obtain a higher value.

Samples No. 21, 22 and 23

According to Table 1, it could be confirmed that Samples No. 21 where Ta was selected as C, Samples No. 22 where both Ta and Nb were selected and Samples No. 23 where Nb was selected showed similar properties, wherein, all of the three samples were dielectric films containing $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb).

Samples No. 21, 24 and 27

According to Table 1, it could be confirmed that Samples No. 21 where Ca was selected as B, Samples No. 24 where both Ca and Sr were selected and Samples No. 27 where Sr was selected showed similar properties, wherein, all of the three samples were dielectric films containing $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb).

Samples No. 21, 22 to 29

According to Table 1, it could be confirmed that Samples No. 21, 22 to 29, where the combination of the selected elements as B and C were various, showed similar properties, wherein, all of the samples were dielectric films containing $A_\alpha B_\beta C_{2\gamma} O_{\alpha+\beta+5\gamma}$ (wherein A represents Ba, B represents at least one element selected from the group consisting of Ca and Sr, and C represents at least one element selected from the group consisting of Ta and Nb).

Samples No. 21, 30, 31

According to Table 1, it could be confirmed that the samples would show similar properties by using the dielectric film of the present embodiment as long as the compositions were the same even if the thicknesses of the dielectric film were different.

Example 2

A sample was prepared using the same method as Sample No. 21 of Example 1 except a sputtering method was used to depositing the film and same evaluation as in Example 1 was carried out. The results were shown in Table 2.

TABLE 2

| Sample No. | A | α | B | β | C | γ | relative permittivity (—) | Q value (—) | Vbd (V/μm) | moisture resistance | film thickness (nm) | film forming method |
|---|---|---|---|---|---|---|---|---|---|---|---|---|
| Example 1 | 21 | Ba | 0.140 | Ca | 0.852 | Ta | 0.008 | 14 | 790 | 1240 | ◎ | 400 | PLD |
| Example 2 | 37 | Ba | 0.140 | Ca | 0.852 | Ta | 0.008 | 14 | 800 | 1300 | ◎ | 400 | Sputtering |

Samples No. 21, 37

According to Table 2, it could be confirmed that the samples would show similar properties by using the dielectric film of the present embodiment as long as the compositions were the same even if the preparation methods of the dielectric film were different.

As described above, the present invention relates to a dielectric composition and an electronic component. In particular, the present invention provides a dielectric composition and an electronic component using this dielectric composition, in which the dielectric composition and the electronic component have a high relative permittivity, a high Q value, and a high dielectric breakdown voltage even when under a high frequency (2 GHz). In this respect, the electronic component using the dielectric composition can be downsized and provided with excellent performance. The present invention widely provides novel technologies to a film component working at a high frequency which uses dielectric films such as a diplexer or a band-pass filter or the like.

DESCRIPTION OF REFERENCE NUMERALS

1 Supporting substrate
2 Foundation layer
3 Lower electrode
4 Upper electrode
5 Dielectric film
10 Film capacitor

What is claimed is:

1. A dielectric composition comprising a complex oxide represented by a formula of $A_\alpha B_\beta C_{2\gamma} O_{\alpha+\beta+5\gamma}$ as main component, wherein,
A represents Ba,
B represents at least one element selected from the group consisting of Ca and Sr,
C represents at least one element selected from the group consisting of Ta and Nb,
α, β and γ meet the following conditions:
$\alpha+\beta+\gamma=1.000$,
$0.000<\alpha\leq0.375$,
$0.625\leq\beta<1.000$, and
$0.000\leq\gamma\leq0.375$, and
the dielectric composition is in a form of a film having a thickness of 10 nm to 2000 nm.

2. The dielectric composition of claim 1 comprising the complex oxide as the main component, wherein,
in the formula, α, β and γ meet the following conditions:
$\alpha+\beta+\gamma=1.000$,
$0.000<\alpha\leq0.375$,
$0.625\leq\beta<1.000$, and
$0.000<\gamma\leq0.375$.

3. The dielectric composition of claim 1 comprising the complex oxide as the main component, wherein,
in the formula, β, β and γ meet the following conditions:
$\alpha+\beta+\gamma=1.000$,
$0.100\leq\alpha\leq0.375$,
$0.625\leq\beta\leq0.900$, and
$0.000<\gamma\leq0.275$.

4. The dielectric composition of claim 1 comprising the complex oxide as the main component, wherein,
in the formula, β, β and γ meet the following conditions:
$\alpha+\beta+\gamma=1.000$,
$0.000<\alpha\leq0.180$,
$0.770\leq\beta<1.000$, and
$0.000<\gamma\leq0.050$.

5. The dielectric composition of claim 1 comprising the complex oxide as the main component, wherein,
in the formula, β, β and γ meet the following conditions:
$\alpha+\beta+\gamma=1.000$,
$0.000<\alpha\leq0.215$,
$0.770\leq\beta<1.000$, and
$0.000<\gamma\leq0.015$.

6. The dielectric composition of claim 1 comprising the complex oxide as the main component, wherein,
in the formula, β, β and γ meet the following conditions:
$\alpha+\beta+\gamma=1.000$,
$0.100\leq\alpha\leq0.180$,
$0.805\leq\beta\leq0.900$, and
$0.000<\gamma\leq0.015$.

7. An electronic component comprising the dielectric composition of claim 1.

8. An electronic component comprising the dielectric composition of claim 2.

9. An electronic component comprising the dielectric composition of claim 3.

10. An electronic component comprising the dielectric composition of claim 4.

11. An electronic component comprising the dielectric composition of claim 5.

12. An electronic component comprising the dielectric composition of claim 6.

13. The dielectric composition of claim 1, wherein the film has a thickness of from 50 nm to 1000 nm.

* * * * *